United States Patent
Conn et al.

(10) Patent No.: US 7,667,473 B1
(45) Date of Patent: Feb. 23, 2010

(54) FLIP-CHIP PACKAGE HAVING THERMAL EXPANSION POSTS

(75) Inventors: Robert O. Conn, Laupahoehoe, HI (US); Steven J. Carey, San Jose, CA (US)

(73) Assignee: XILINX, Inc, San Jose, CA (US)

( * ) Notice: Subject to any disclaimer, the term of this patent is extended or adjusted under 35 U.S.C. 154(b) by 0 days.

(21) Appl. No.: 11/238,419

(22) Filed: Sep. 28, 2005

(51) Int. Cl.
*G01R 31/02* (2006.01)
(52) U.S. Cl. .................. 324/755; 438/108; 257/738
(58) Field of Classification Search .............. 324/754, 324/758, 764, 765; 438/612–613, 108, 687–688; 257/737–738, 778–779, 782
See application file for complete search history.

(56) References Cited

U.S. PATENT DOCUMENTS

| | | | | |
|---|---|---|---|---|
| 5,289,631 A | * | 3/1994 | Koopman et al. | 29/840 |
| 5,329,423 A | * | 7/1994 | Scholz | 361/760 |
| 5,468,995 A | * | 11/1995 | Higgins, III | 257/697 |
| 5,477,160 A | * | 12/1995 | Love | 324/755 |
| 5,494,856 A | * | 2/1996 | Beaumont et al. | 438/15 |
| 5,608,265 A | * | 3/1997 | Kitano et al. | 257/738 |
| 5,611,884 A | * | 3/1997 | Bearinger et al. | 156/325 |
| 5,640,052 A | * | 6/1997 | Tsukamoto | 257/781 |
| 5,790,377 A | * | 8/1998 | Schreiber et al. | 361/704 |
| 6,007,349 A | * | 12/1999 | Distefano et al. | 439/71 |
| 6,681,982 B2 | * | 1/2004 | Tung | 228/197 |
| 6,695,623 B2 | * | 2/2004 | Brodsky et al. | 439/66 |
| 6,819,127 B1 | * | 11/2004 | Hembree | 324/755 |
| 6,828,669 B2 | * | 12/2004 | Iijima et al. | 257/700 |
| 6,891,258 B1 | | 5/2005 | Alexander et al. | |
| 7,135,765 B2 | * | 11/2006 | Venkateswaran | 257/698 |
| 2006/0087309 A1 | * | 4/2006 | Fu et al. | 324/158.1 |
| 2006/0138647 A1 | * | 6/2006 | Crisp et al. | 257/723 |
| 2006/0181298 A1 | * | 8/2006 | Farnworth et al. | 324/765 |
| 2007/0052909 A1 | * | 3/2007 | Chou et al. | 349/155 |
| 2007/0269928 A1 | * | 11/2007 | Farooq et al. | 438/108 |

\* cited by examiner

*Primary Examiner*—Ha Tran T Nguyen
*Assistant Examiner*—Arleen M Vazquez
(74) *Attorney, Agent, or Firm*—William L. Paradice, III; John J. King

(57) ABSTRACT

A semiconductor package having a substrate and a die includes a plurality of conductive posts attached to the substrate and bonded to an active surface of the die via a plurality of corresponding microbumps. The conductive posts are flexible and extend beyond the top surface of the substrate a sufficient distance to absorb lateral forces exerted upon the microbumps.

9 Claims, 4 Drawing Sheets

US 7,667,473 B1

FLIP-CHIP PACKAGE HAVING THERMAL EXPANSION POSTS

FIELD OF INVENTION

The present invention relates generally to semiconductor devices, and more specifically to semiconductor packages containing integrated circuit dice.

DESCRIPTION OF RELATED ART

Typically, a plurality of integrated circuits (ICs) are formed on a semiconductor (e.g., silicon) wafer, which is then cut or "diced" to separate individual ICs from one another. The resulting bare IC dice (e.g., chips) are then packaged to protect them from external conditions. An IC package typically includes an IC die mounted on a substrate and encapsulated with a protective material. Conductive contacts formed on the die are electrically connected to corresponding pads formed on a first surface of the substrate. External leads formed on a second surface of the substrate and electrically connected to the pads on the first surface via the substrate's interconnect circuitry provide electrical connections to external systems (e.g., to other packaged dice) via a carrier such as a Printed Circuit Board (PCB).

A variety of die packaging techniques exists. For example, in one technique commonly known as Chip-On-Board (COB) packaging, the back-side surface of a bare IC die is directly mounted on the surface of a substrate, and bond pads on the active surface (i.e., the front-side surface) of the bare die are wire-bonded to corresponding pads on the surface of the substrate. In another technique commonly known as flip-chip packaging, conductive pads on the front-side surface of a bare IC die are bonded directly to corresponding pads formed on the surface of a substrate via conductive bumps. By replacing the wire bonds with conductive bumps, flip-chip technology not only reduces signal propagation delays between the die and the substrate but also saves area because the space previously required for wire bond connections can be made available for other purposes, for example, to accommodate larger dice and/or to reduce package size.

For example, FIG. 1A shows a cross-sectional view of an IC package 100 having a die 110 flip-chip mounted to a substrate 120. An array of conductive pads 121 are formed on a top surface 120t of substrate 120 from a solder mask layer 122 in a well-known manner. An array of conductive balls 140 are formed on a bottom surface 120b of substrate 120 and are electrically connected to conductive pads 121 via any number of interconnect layers (not shown for simplicity) provided within substrate 120. A plurality of flip-chip bumps (e.g., microbumps) 130 formed on an active surface 110a of die 110 extend through holes in solder mask layer 122 and contact corresponding conductive pads 121 to provide electrical connections between die 110 and substrate 120. Typically, microbumps 130 are bonded to corresponding conductive pads 121 using a well-known solder reflow process. A heatsink 150, which serves as a protective lid for package 100, may be attached to substrate 120 using a suitable bonding layer 160 such as epoxy to encapsulate die 110. A suitable layer 170 of underfill material may be used to hold die 110 in place and to encapsulate microbumps 130.

Referring also to FIG. 1B, which shows an expanded cross-sectional view of a flip-chip connection 200 between die 110 and substrate 120, microbump 130 makes electrical contact with die 110 via a conductive contact 111 formed on the active surface 110a of die 110, and makes contact with substrate 120 via conductive pad 121. As shown in FIG. 1B, the top surface of conductive pad 121 typically includes a plating layer 123 that contacts microbump 130. As known in the art, a well-known reflow process may be used to bond microbump 130 to conductive pad 121 via plating layer 123.

Proper operation of package 100 requires maintaining the integrity and proper alignment of microbumps 130 to ensure that electrical signals are properly exchanged between die 110 and substrate 120. For example, if there is a rapid lateral thermal expansion differential between die 110 and substrate 120 (e.g., when die 110 is powered-on), the resulting lateral forces exerted upon microbumps 130 may cause microbumps 130 to develop stress cracks that prevent the proper exchange of electrical signals between die 110 and substrate 120, thereby potentially rendering package 100 unusable. More specifically, if die 110 is initially idle and then experiences significant switching activity (e.g., in response to a burst of network traffic handled by die 110), the temperature of die 110 may rapidly increase in a relatively short period of time. Because silicon has a relatively low coefficient of thermal expansion (CTE), rapid increases in die temperature result in relatively little expansion of die 110. However, due to thermal coupling, rapid increases in die temperature may result in a corresponding rapid temperature increase of substrate 120. Because substrate 120 typically has a relatively high CTE (e.g., compared to die 110), rapid temperature increases of substrate 120 may cause a significant lateral expansion of substrate 120 relative to die 110 in a relatively short time period. Over time, lateral forces caused by a rapid lateral expansion differential between die 110 and substrate 120 and exerted upon microbumps 130 may create stress cracks and/or other physical defects that can lead to failure of package 100 because of faulty electrical connections between die 110 and substrate 120.

Therefore, there is a need in the art for a semiconductor package that allows one or more dice to be flip-chip connected to a substrate using a plurality of microbumps in a manner that reduces the susceptibility of the microbumps to stress cracks and other defects caused by lateral forces exerted upon the microbumps.

SUMMARY

A semiconductor package is disclosed that allows one or more IC dice to be flip-chip connected to a substrate using microbumps in a manner that reduces the susceptibility of the microbumps to stress cracks and other defects caused by lateral forces exerted upon the microbumps resulting, for example, from a rapid thermal expansion differential between and the dice and the substrate. In accordance with an embodiment of the present invention, a semiconductor package includes a plurality of conductive posts that provide electrical connections between a substrate and an IC die. The conductive posts, which are attached to the substrate and extend beyond a top surface of the substrate to make electrical contact with corresponding microbumps provided on an active surface of the IC die, are flexible so that the conductive posts may absorb lateral forces exerted upon the microbumps. In this manner, the conductive posts may increase the durability and reliability of the package by reducing the susceptibility of the microbumps to stress cracks and other defects caused, for example, by a rapid lateral thermal expansion of the substrate relative to the die. For other embodiments, the conductive posts may be mounted to the active surface of the die and electrically connected to the substrate via a plurality of corresponding microbumps.

For some embodiments, the conductive posts are of a height that allows the conductive posts to be sufficiently flexible to absorb lateral forces exerted upon the microbumps. For many embodiments, the conductive posts have a height that is greater than the height of the microbumps. For one embodiment, the conductive posts have a height of approximately 300 microns and the microbumps have a height of approximately 100 microns.

The conductive posts may be any suitable shape, and may have any suitable aspect ratio. For some embodiments, a plating layer formed on a top surface of each conductive post bonds with a corresponding microbump. For other embodiments, the conductive posts may be disposed within a sheath.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is applicable to a variety of integrated circuits and systems. In the following description, for purposes of explanation, specific nomenclature is set forth to provide a thorough understanding of the present invention. However, it will be apparent to one skilled in the art that these specific details may not be required to practice the present invention. In other instances, well-known elements are shown in block diagram form to avoid obscuring the present invention. Accordingly, the present invention is not to be construed as limited to specific examples described herein but rather includes within its scope all embodiments defined by the appended claims.

Figure 1A:
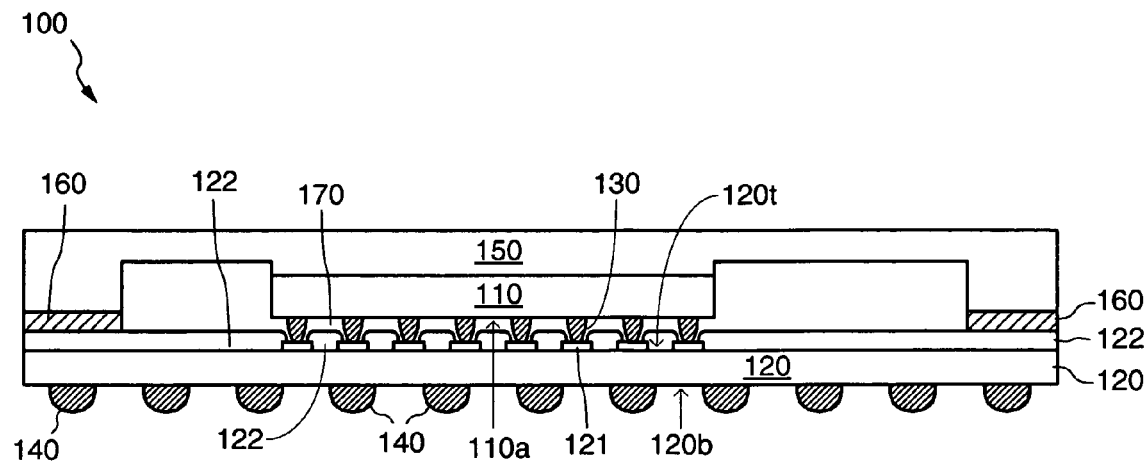
FIG. 1A is a cross-sectional view of a prior art semiconductor package having a die flip-chip mounted to a substrate in a conventional manner.
Figure 1B:
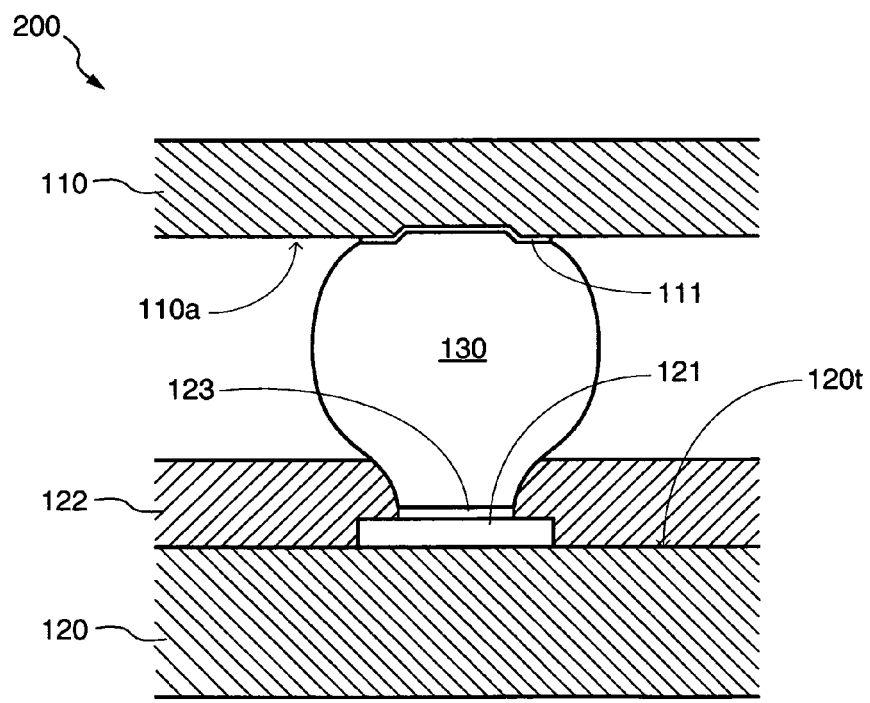
FIG. 1B is an expanded cross-sectional view of a flip-chip connection of FIG. 1A.
Figure 2:
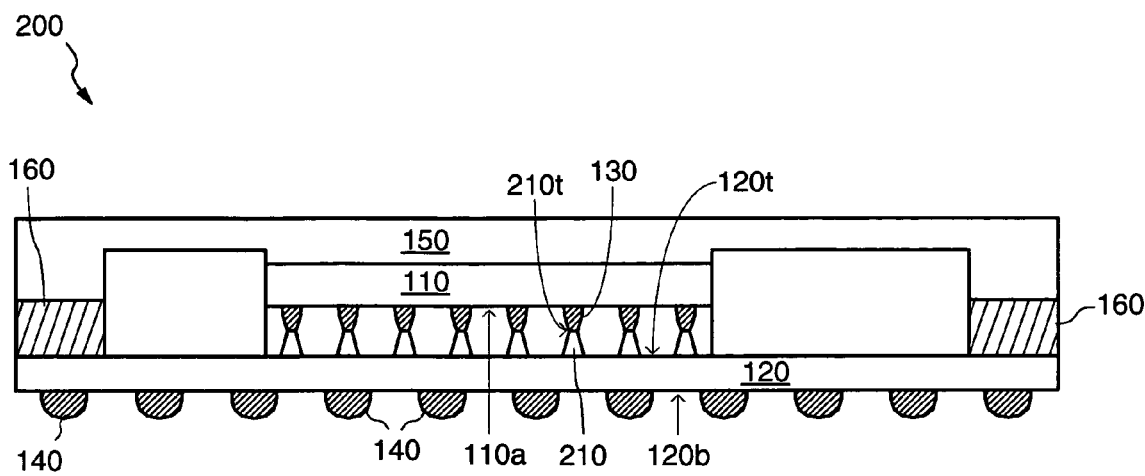
FIG. 2 is a cross-sectional view of a semiconductor package having a die flip-chip mounted to a substrate in accordance with an embodiment of the present invention.

FIG. 2 shows a cross-sectional view of an IC package 200 having a die 110 flip-chip mounted to a substrate 120 in accordance with an embodiment of the present invention. Die 110, which may be formed using well-known techniques, may contain any suitable IC design such as, for example, a programmable logic device (PLD). A plurality of well-known flip-chip microbumps 130 are formed on an active surface 110a of die 110. Substrate 120, which may be made of any suitable material, includes an embedded interconnect structure (not shown for simplicity). The embedded interconnect structure, which may be formed using any suitable technique, may include one or more layers of conductive wires, traces, or other suitable signal lines. A plurality of conductive balls 140 are formed on a bottom surface 120b of substrate 120 to provide electrical connections to external packages and/or systems. For other embodiments, conductive balls 140 may be conductive leads, pins, bumps, or other external contacts. Thus, although depicted in FIG. 2 as a ball grid array (BGA) package, for other embodiments, package 200 may be other suitable package types (e.g., having leads instead of balls).

A heat-sink 150 may be attached to substrate 120 using a suitable bonding layer 160 such as epoxy to encapsulate die 110 and to isolate die 110 and its flip-chip connections to substrate 120 from external environmental conditions. Heat-sink 150 may be formed using any suitable material such as copper, although other suitable heat-dissipating materials may be used.

In accordance with an embodiment of the present invention, package 200 includes a plurality of conductive posts 210 attached to a top surface 120t of substrate 120. Conductive posts 210 are aligned and make electrical contact with corresponding microbumps 130. Together, conductive posts 210 and microbumps 130 provide flip-chip style electrical connections between die 110 and substrate 120. For some embodiments, microbumps 130 are formed of solder and may be bonded to corresponding conductive posts 210 during a well-known solder reflow process. Conductive posts 210, which may be made of any suitable conductive material such as aluminum, extend beyond the top surface 120t of substrate 120 and are of a height that allows conductive posts 210 to be sufficiently flexible to absorb lateral forces exerted upon microbumps 130. For some embodiments, conductive posts 210 extend at least 100 microns above the top surface 120 of substrate 120, although substrates that house smaller dice may utilize shorter conductive posts 210 and substrates that house larger dice may utilize taller posts 210. For many embodiments, conductive posts 210 are of a height that is greater than the height of microbumps 130. For one exemplary embodiment, conductive posts 210 are approximately 300 microns high, and microbumps 130 are approximately 100 microns high.

Conductive posts 210 may be of any suitable width. For one exemplary embodiment, conductive posts 210 have an aspect ratio of approximately 6:1. Further, conductive posts 210 may have any suitable lateral cross-sectional shape (e.g., circular, rectangular, elliptical, and so on), and may have any suitable vertical cross-sectional shape (e.g., cylindrical, conical, and so on). Thus, although depicted in FIG. 2 as having a conical vertical shape, for other embodiments, conductive posts 210 may have a cylindrical vertical shape. In addition, the spacing between posts 210 may be any suitable distance.

By employing conductive posts 210 that are flexible to provide electrical connections between die 110 and substrate 120 via microbumps 130, embodiments of the present invention may significantly reduce the susceptibility of microbumps 130 to stress cracks and other defects caused by a rapid lateral expansion of substrate 120 relative to die 110, thereby increasing the durability and reliability of package 200. Note that for some embodiments, package 200 does not include any underfill material interposed between die 110 and substrate 120, thereby maximizing the flexibility of conductive posts 210.

For simplicity, the exemplary package 200 of FIG. 2 is shown as having only a few balls 140. However, in actual embodiments, package 200 may have hundreds or even thousands of balls 140. Similarly, although package 200 is shown in FIG. 2 as having only a few microbumps 130 and corresponding conductive posts 210, for actual embodiments, package 200 may have hundreds or even thousands of microbumps 130 and corresponding conductive posts 210.

Figure 3:
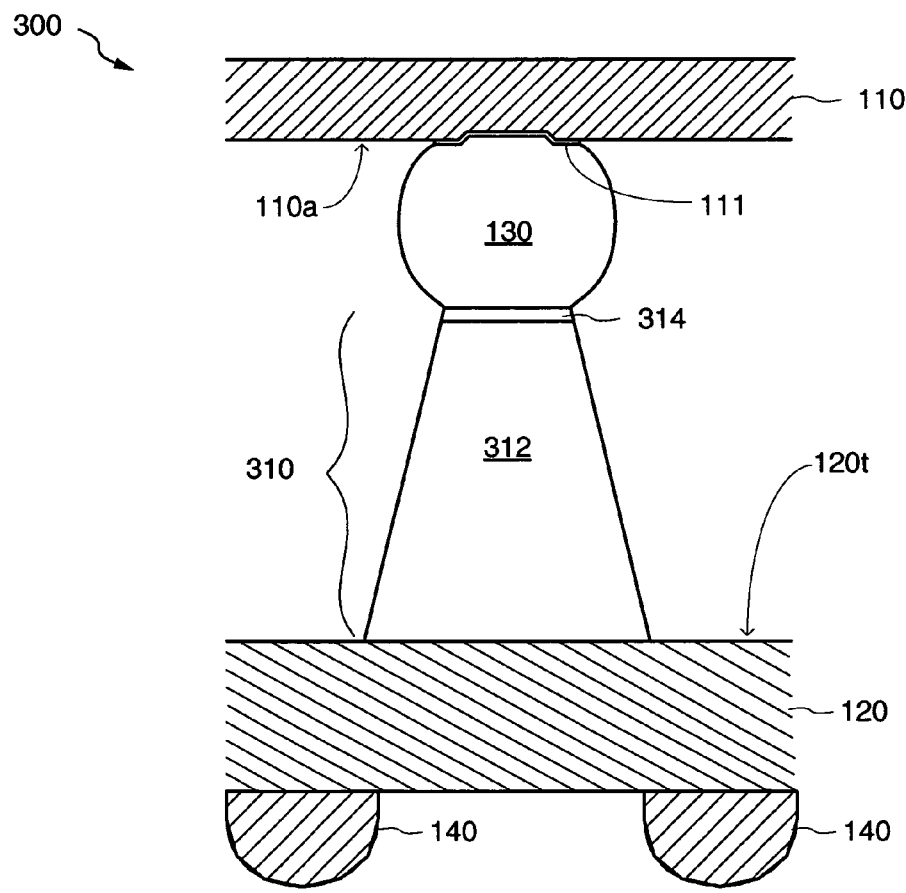
FIG. 3 is an expanded cross-sectional view of one embodiment of a flip-chip connection of FIG. 2.

FIG. 3 shows an expanded cross-sectional view 300 of package 200 illustrating a post structure 310 in accordance with some embodiments of the present invention. Post structure 310 includes a conductive post 312 and a plating layer 314. Conductive post 312 is attached to substrate 120, and extends beyond the top surface 120t of substrate 120 a sufficient distance that allows post structure 310 to be sufficiently flexible to absorb lateral forces exerted upon microbumps 130. Plating layer 314 is provided on a top surface of post 312 and makes electrical contact with microbump 130, which in turn makes electrical contact with die 110 via a conductive pad 111. Conductive pad 111, which is sometimes referred to as a flip-chip pad, may be formed as part of a well-known bumping process such as screen printing or selective plating.

Conductive post 312 and plating layer 314 may be any suitable conductive materials. For some embodiments, conductive post 312 is made of a material such as aluminum to which solder melted from microbumps 130 does not bond, and plating layer 314 is made of a material such as copper to which solder melted from microbumps 130 bonds, although other materials may be used for conductive post 312 and/or plating layer 314. Similarly, microbump 130 may be any suitable material. For some embodiments, microbump 130 is formed using a well-known reflow soldering process, although other techniques may be used.

Conductive post 312 and plating layer 314 may be formed using any suitable technique. For example, a post structure 310 that extends approximately 300 microns beyond the top surface 120t of substrate 120 may be formed as follows. First, a layer of aluminum approximately 280 microns thick is deposited on the top surface 120t of substrate 120 using well-known techniques. A layer of copper approximately 20 microns thick is then deposited onto the layer of aluminum using well-known techniques. A well-known photoresist, patterning, and etching process is employed to etch away the copper and aluminum layers to form the post structure 310 illustrated in FIG. 3. Thereafter, die 110 may be placed with its active-side 110a down over substrate 120 so that solder microbump 130 aligns with post structure 310. During a well-known reflow process, solder within microbump 130 may be melted to bond microbump 130 to plating layer 314. Because post 312 is made of aluminum, the solder does not bond to post 312.

For another embodiment, post 310 may be formed by first forming a layer of dissolvable material over the top surface 120t of substrate 120 using well-known techniques. Then, using well-known techniques, a hole is formed in the dissolvable layer to expose a corresponding portion of substrate 120, and the hole is filled with a suitable conductive material such as copper. Thereafter, the dissolvable material is washed away to form the post 312 illustrated in FIG. 3.

Figure 4:
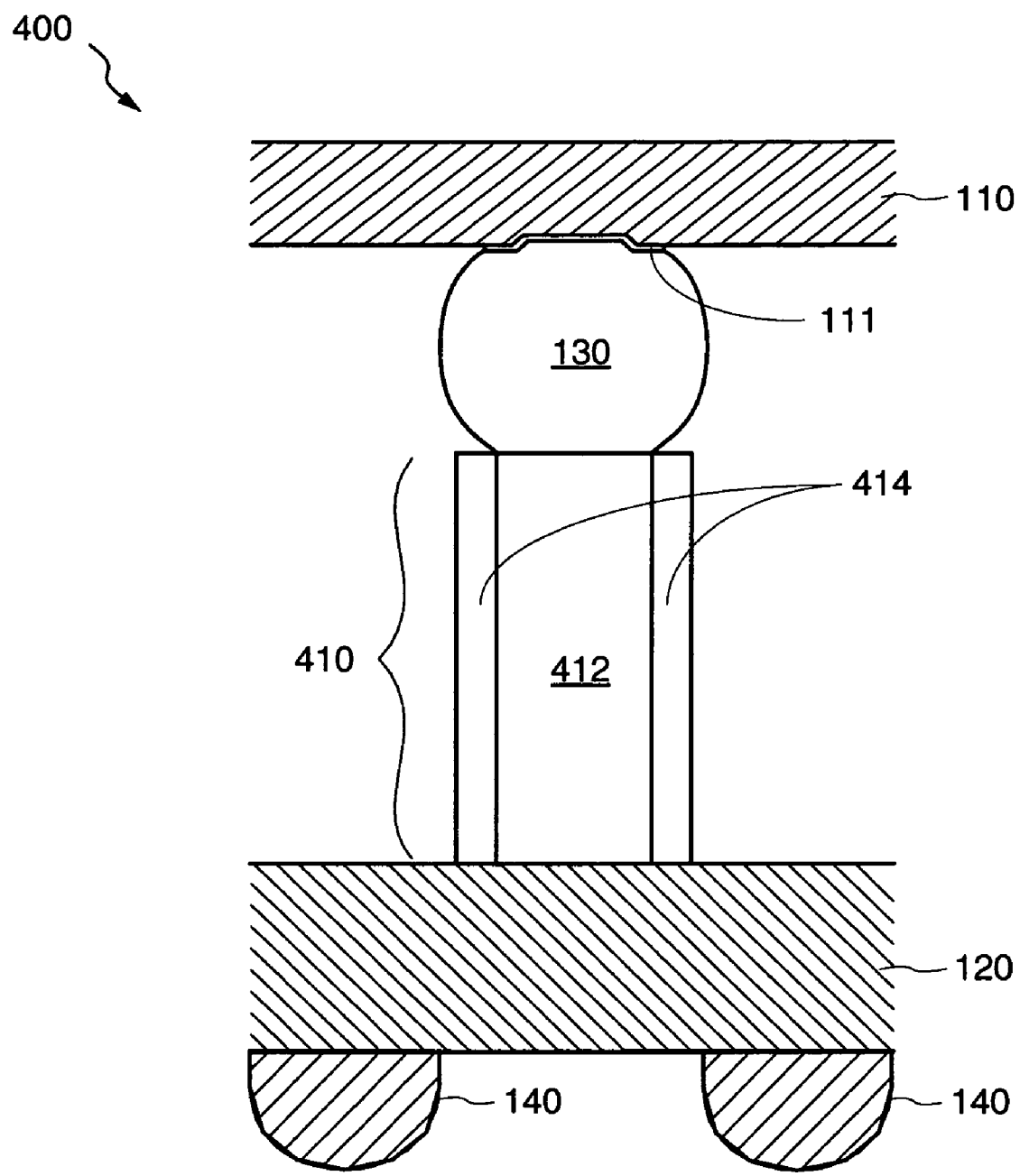
FIG. 4 is an expanded cross-sectional view of another embodiment of a flip-chip connection of FIG. 2.

FIG. 4 shows an expanded cross-sectional view 400 of package 200 illustrating a post structure 410 in accordance with other embodiments of the present invention. Post structure 410 includes a conductive post 412 and an outer sheath 414. Conductive post 412 is attached to substrate 120, and extends beyond the top surface 120t of substrate 120 a sufficient distance that allows post structure 410 to be sufficiently flexible to absorb lateral forces exerted upon microbumps 130. Post 412, which is surrounded by outer sheath 414, makes electrical contact with microbump 130. Conductive post 412 and outer sheath 414 may be any suitable conductive materials. For some embodiments, conductive post 412 is made of a material such as copper to which solder melted from microbumps 130 bonds, and outer sheath 414 is made of a material such as aluminum to which solder melted from microbumps 130 does not bond, although other materials may be used for conductive post 412 and/or outer sheath 414. For example, for another embodiment, post 412 may be a copper and beryllium composition to provide maximum flexibility.

Conductive post 412 and outer sheath 414 may be formed using any suitable technique. For example, a post structure 410 that extends approximately 300 microns beyond the top surface 120t of substrate 120 may be formed as follows. First, a layer of aluminum approximately 300 microns thick is deposited on the top surface 120t of substrate 120 using well-known techniques. A well-known photoresist, patterning, and etching process is employed to form a hole having a diameter of approximately 90 microns within the aluminum layer. The hole is filled with copper using a suitable technique to form post 412. Then, a well-known photoresist, patterning, and etching process is employed to etch away the aluminum layer to form the post structure 410 illustrated in FIG. 4. Thereafter, die 110 may be placed with its active-side 110a down over substrate 120 so that solder microbump 130 aligns with post structure 310. During a well-known reflow process, solder within microbump 130 may be melted to bond microbump 130 to post 412. Because outer sheath 414 is made of aluminum, the solder does not bond to outer sheath 414.

Referring again to FIG. 2, for other embodiments, a well-known interposer structure (not shown for simplicity) may be disposed between die 110 and substrate 120, and conductive posts 210 may be formed on a top surface of the interposer structure to make electrical contact with die 110 via microbumps 130. For such embodiments, the interposer structure may be mounted onto and electrically connected to substrate 120 using microbumps in a well-known manner. As known in the art, the interposer structure may include bypass capacitors, signal transmission and/re-distribution structures, and the like. For some embodiments, the interposer structure disposed between die 110 and substrate 120 of package 200 may be of the type described in U.S. Pat. No. 6,891,258, which is assigned to the assignee of the present invention and is incorporated by reference herein.

Figure 5:
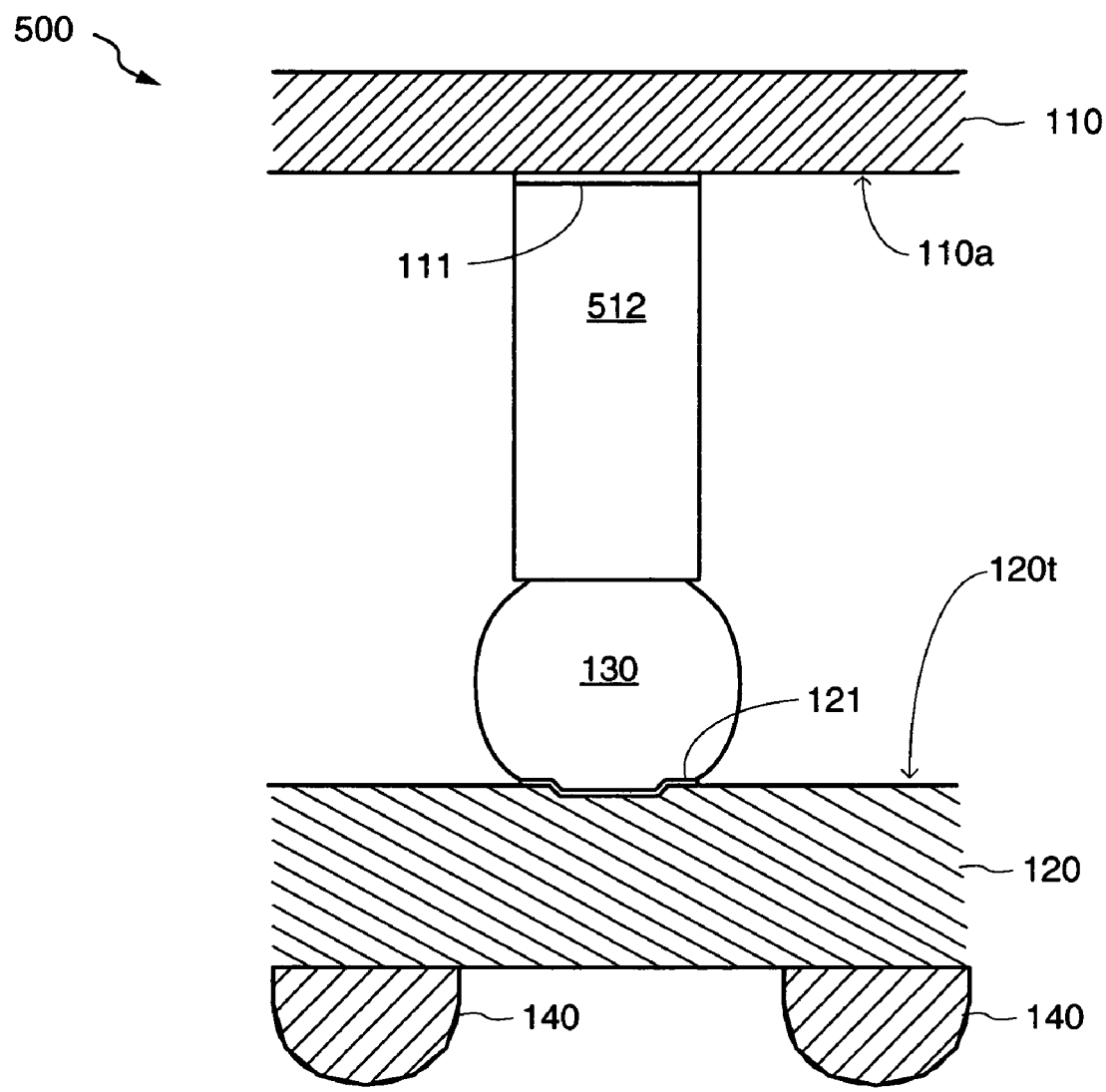
FIG. 5 is an expanded cross-sectional view of yet another embodiment of a flip-chip connection of FIG. 2.

As discussed above with respect to FIG. 2, embodiments of the present invention reduce the susceptibility of microbumps 130 to lateral forces by providing flexible, conductive posts 210 on substrate 120 to provide electrical connections between substrate 120 and die 110. For other embodiments, conductive posts 210 may be formed on the active side 110a of die 110 and configured to make electrical contact with substrate 120 via microbumps 130, for example, as depicted by posts 512 of FIG. 5.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although described above in the context of an IC package 200 containing a single die 110, embodiments of the present invention are equally applicable to IC packages containing more than one die 110.

What is claimed is:

1. A semiconductor package, comprising:
    a die having a plurality of solder bumps formed on an active surface thereof;
    a substrate;
    a plurality of conductive post structures mounted on a top surface of the substrate, each aligned to make electrical contact with a corresponding solder bump, wherein the conductive post structures are flexible to absorb lateral forces exerted upon the solder bumps, wherein each conductive post structure comprises:

a conductive post mounted to the substrate, the conductive post comprising a first layer of a material to which the solder bumps do not bond extending upward from the substrate; and a second layer comprising a plating layer attached to a top surface of the conductive post and extending upward from the first layer to and in electrical contact with the corresponding solder bump, wherein sides of the first layer are not covered by the second layer comprising the plating layer; and a lid attached to the substrate by a bonding material, wherein the lid encapsulates the die.

2. The semiconductor package of claim 1, wherein the conductive post structures extend beyond the top surface of the substrate by at least 100 microns.

3. The semiconductor package of claim 1, wherein the conductive post structures have a height that is greater than a height of the solder bumps.

4. The semiconductor package of claim 1, wherein the conductive post structures have a height approximately equal to 300 microns and the solder bumps have a height approximately equal to 100 microns.

5. The semiconductor package of claim 1, wherein the conductive post comprises aluminum and the plating layer comprises copper.

6. A semiconductor package, comprising:

a substrate having a plurality of solder bumps formed on a top surface thereof;

a die comprising a plurality of conductive pads on an active surface of the die on a side of the die adjacent to the substrate;

a plurality of conductive post structures attached to the plurality of conductive pads on the active surface of the die, wherein each conductive post structure comprises a conductive post having a first layer of a material to which the solder bumps do not bond extending downward from the side of the die adjacent to the substrate and a second layer comprising a plating layer on an end of the conductive post which is bonded to a corresponding solder bump, wherein sides of the first layer are not covered by the second layer comprising the plating layer and the conductive post structure is flexible to absorb lateral forces exerted upon the solder bumps; and a lid attached to the substrate by a bonding material, wherein the lid encapsulates the die.

7. The semiconductor package of claim 6, wherein the conductive posts extend beyond the active surface of the die by at least 100 microns.

8. The semiconductor package of claim 6, wherein the conductive posts have a height that is greater than a height of the conductive bumps.

9. The semiconductor package of claim 6, wherein the conductive posts have a height approximately equal to 300 microns and the solder bumps have a height approximately equal to 100 microns.

\* \* \* \* \*